US009847173B2

(12) United States Patent
Taniguchi et al.

(10) Patent No.: US 9,847,173 B2
(45) Date of Patent: Dec. 19, 2017

(54) MOUNTING SUBSTRATE (71) Applicant: Murata Manufacturing Co., Ltd., Nagaokakyo-shi, Kyoto-fu (JP)

(72) Inventors: Masaaki Taniguchi, Nagaokakyo (JP); Yasuji Yamamoto, Nagaokakyo (JP); Takahiro Ishibashi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/185,099

(22) Filed: Jun. 17, 2016

(65) Prior Publication Data

US 2016/0381802 A1  Dec. 29, 2016

(30) Foreign Application Priority Data

Jun. 26, 2015 (JP) .................. 2015-128854
Apr. 7, 2016 (JP) .................. 2016-077394

(51) Int. Cl.
| | |
|---|---|
| *H01G 4/248* | (2006.01) |
| *H01G 4/008* | (2006.01) |
| *H01G 4/12* | (2006.01) |
| *H01G 4/30* | (2006.01) |
| *H01G 4/232* | (2006.01) |
| *H05K 1/02* | (2006.01) |
| *H05K 1/11* | (2006.01) |
| *H05K 3/34* | (2006.01) |

(52) U.S. Cl.
CPC ............ *H01G 4/248* (2013.01); *H01G 4/008* (2013.01); *H01G 4/12* (2013.01); *H01G 4/232* (2013.01); *H01G 4/30* (2013.01); *H05K 1/0243* (2013.01); *H05K 1/111* (2013.01); *H05K 3/3442* (2013.01); *H05K 2201/10015* (2013.01); *Y02P 70/611* (2015.11)

(58) Field of Classification Search
CPC ...................................... H05K 1/181
USPC .......................................... 174/260
See application file for complete search history.

(56) References Cited

FOREIGN PATENT DOCUMENTS

JP  2004-296940 A  10/2004

*Primary Examiner* — Hoa C Nguyen
*Assistant Examiner* — Stanley Tso
(74) *Attorney, Agent, or Firm* — Keating & Bennett, LLP (57) ABSTRACT

A multilayer ceramic capacitor connected to an output electrode and an input electrode of a mounting substrate includes a laminated body. In the laminating direction of the laminated body, the shortest distance from an outer first internal electrode to the surface of an external electrode on the side closer to a first principal surface, and the shortest distance from an outer second internal electrode to the surface of an external electrode on the side closer to a second principal surface are each about 40 μm or less. In the width direction of the laminated body, the shortest distance from an end of an internal electrode to the surface of the external electrode on the side closer to a first side surface, and the shortest distance from an end of an internal electrode to the surface of the external electrode on the side closer to a second side surface are each about 40 μm or less.

16 Claims, 8 Drawing Sheets

MOUNTING SUBSTRATE

CROSS REFERENCE TO RELATED APPLICATIONS

This application claims the benefit of priority to Japanese Patent Application 2016-077394 filed Apr. 7, 2016 and Japanese Patent Application 2015-128854 filed Jun. 26, 2015. The entire content of each application are hereby incorporated by reference.

BACKGROUND OF THE INVENTION

1. Field of the Invention

The present invention relates to a mounting substrate, and more particularly, to a mounting substrate mounted with a multilayer ceramic capacitor including a laminated body including a plurality of dielectric layers laminated and a plurality of internal electrodes; and external electrodes on end surfaces of the laminated body to be electrically connected to the internal electrodes.

2. Description of the Related Art

In electronic circuits that use ICs such as operational amplifiers, direct currents are superimposed at transistors on signals output from the ICs, thereby amplifying the signals, and the amplified signals are transmitted to a next electronic component. However, depending on the electronic component that receives the signals, it may be advantageous to suppress the flow of direct current, and to receive only signals. Therefore, a capacitor is inserted between the ICs and the electronic component that receives the signals, thereby causing the signals to pass with signal attenuation suppressed. This capacitor is referred to as a coupling capacitor. This coupling capacitor is required to be lower in insertion loss in a wider frequency region, in order to keep signals from being attenuated in a wide range of frequencies.

The insertion loss is largely affected by a component of electrostatic capacitance in a low-frequency region, and largely affected by two components of equivalent series inductance and equivalent series resistance in a high-frequency region.

In this regard, there is, as a coupling capacitor the multilayer capacitor described in Japanese Patent Application Laid-Open No. 2004-296940. Japanese Patent Application Laid-Open No. 2004-296940 discloses mounting the multilayer capacitor on a substrate such that internal electrodes of the multilayer capacitor are perpendicular or substantially perpendicular to the planar direction of a mounting surface of the substrate, for further lowering the equivalent series inductance. In this regard, as a method for mounting the multilayer capacitor, a method is typically adopted in which the multilayer capacitor subjected to taping is picked up with a nozzle of a mounting machine and mounted on the substrate. Therefore, there is a need for alignment in advance such that the direction of laminating the internal electrodes has the same direction, in order to make the internal electrodes perpendicular or substantially perpendicular to the planar direction of the mounting surface of the substrate.

However, multilayer ceramic capacitors such as the multilayer capacitor described in Japanese Patent Application Laid-Open No. 2004-296940 have internal electrodes buried therein, and the laminating directions of the internal electrodes are difficult to determine by appearance. Therefore, there is a need to determine the laminating directions of the internal electrodes before taping is applied to the multilayer ceramic capacitors, besides the cost for the determination, it is not possible to keep the equivalent series inductance low when the orientations of the internal electrodes are wrong, and as a result, there is a risk of causing insertion loss characteristics to vary in high-frequency regions in the case of mounting on substrates.

SUMMARY OF THE INVENTION

Preferred embodiments of the present invention provide a mounting substrate mounted with a multilayer ceramic capacitor which shows little change in insertion loss characteristics due to a difference in mounting attitude.

A mounting substrate according to a preferred embodiment of the present invention is a mounting substrate including an output electrode that outputs signals including a frequency region of 10 GHz or higher, an input electrode that inputs signals including a frequency region of 10 GHz or higher, and a multilayer ceramic capacitor connected to the output electrode and the input electrode, wherein the multilayer ceramic capacitor includes a parallelepiped shape laminated body, the laminated body includes a plurality of dielectric layers laminated and a plurality of internal electrodes, and includes a first principal surface and a second principal surface opposed in a laminating direction, a first side surface and a second side surface opposed in a width direction perpendicular or substantially perpendicular to the laminating direction, and a first end surface and a second end surface opposed in a length direction perpendicular or substantially perpendicular to the laminating direction and the width direction, the multilayer ceramic capacitor includes a first external electrode to cover the first end surface, and extend from the first end surface and cover the first principal surface, the second principal surface, the first side surface, and the second side surface, and a second external electrode to cover the second end surface, and extend from the second end surface and cover the first principal surface, the second principal surface, the first side surface, and the second side surface, the plurality of internal electrodes includes a first internal electrode connected to the first external electrode and a second internal electrode connected to the second external electrode, and as viewed in respective cross sections including the first external electrode and second external electrode on the first principal surface, the second principal surface, the first side surface, and the second side surface, a longest dimension is about 40 μm or less among dimensions in the laminating direction from the internal electrode located closest to the first principal surface in the laminating direction, among the first internal electrode and the second internal electrode, to the surface of the external electrode disposed on the side closer to the first principal surface, and from the internal electrode located closest to the second principal surface in the laminating direction, among the first internal electrode and the second internal electrode, to the surface of the external electrode disposed on the side closer to the second principal surface, and a longest dimension is about 40 μm or less among dimensions in a width direction from the surface of the first internal electrode or second internal electrode located closest to the first side surface in the width direction, among the first internal electrode and the second internal electrode, to the surface of the external electrode disposed on the side closer to the first side surface, and from the surface of the first internal electrode or second internal electrode located closest to the second side surface in the width direction, among the first internal electrode and the second internal electrode, to the surface of the external electrode disposed on the side closer to the second side surface.

A mounting substrate according to a preferred embodiment of the present invention includes an output electrode that outputs signals including a frequency region of 10 GHz or higher, an input electrode that inputs signals including a frequency region of 10 GHz or higher, and a multilayer ceramic capacitor connected to the output electrode and the input electrode, wherein the multilayer ceramic capacitor includes a parallelepiped shape laminated body, the laminated body includes a plurality of dielectric layers laminated and a plurality of internal electrodes, and includes a first principal surface and a second principal surface opposed in a laminating direction, a first side surface and a second side surface opposed in a width direction perpendicular or substantially perpendicular to the laminating direction, and a first end surface and a second end surface opposed in a length direction perpendicular or substantially perpendicular to the laminating direction and the width direction, the multilayer ceramic capacitor includes a first external electrode to cover the first end surface, and extend from the first end surface and cover the first principal surface, the second principal surface, the first side surface, and the second side surface, and a second external electrode to cover the second end surface, and extend from the second end surface and cover the first principal surface, the second principal surface, the first side surface, and the second side surface, the plurality of internal electrodes includes a first internal electrode connected to the first external electrode and a second internal electrode connected to the second external electrode, as viewed in respective cross sections including the first external electrode and second external electrode on the first principal surface, the second principal surface, the first side surface, and the second side surface, a longest dimension is about 40 µm or less among dimensions in the laminating direction from the internal electrode located closest to the first principal surface in the laminating direction, among the first internal electrode and the second internal electrode, to the surface of the external electrode disposed on the side closer to the first principal surface, and from the internal electrode located closest to the second principal surface in the laminating direction, among the first internal electrode and the second internal electrode, to the surface of the external electrode disposed on the side closer to the second principal surface, and a longest dimension is about 40 µm or less among dimensions in a width direction from the surface of the first internal electrode or second internal electrode located closest to the first side surface in the width direction, among the first internal electrode and the second internal electrode, to the surface of the external electrode disposed on the side closer to the first side surface, and from the surface of the first internal electrode or second internal electrode located closest to the second side surface in the width direction, among the first internal electrode and the second internal electrode, to the surface of the external electrode disposed on the side closer to the second side surface, and the multilayer ceramic capacitor provided for the mounting substrate includes a multilayer ceramic capacitor mounted such that the plurality of internal electrodes of the multilayer ceramic capacitor is parallel or substantially parallel to a mounting surface, and a multilayer ceramic capacitor mounted such that the plurality of internal electrodes of the multilayer ceramic capacitor is perpendicular or substantially perpendicular to a mounting surface.

In a mounting substrate according to a preferred embodiment of the present invention, a difference is preferably about 10 µm or less between a longest dimension among dimensions in the laminating direction from the internal electrode located closest to the first principal surface in the laminating direction, among the first internal electrode and the second internal electrode, to the surface of the external electrode disposed on the side closer to the first principal surface, and from the internal electrode located closest to the second principal surface in the laminating direction, among the first internal electrode and the second internal electrode, to the surface of the external electrode disposed on the side closer to the second principal surface, and a longest dimension among dimensions in a width direction from the surface of the first internal electrode or second internal electrode located closest to the first side surface in the width direction, among the first internal electrode and the second internal electrode, to the surface of the external electrode disposed on the side closer to the first side surface, and from the surface of the first internal electrode or second internal electrode located closest to the second side surface in the width direction, among the first internal electrode and the second internal electrode, to the surface of the external electrode disposed on the side closer to the second side surface.

In a mounting substrate according to a preferred embodiment of the present invention, a plurality of first internal electrodes and a plurality of second internal electrodes are provided, the first internal electrodes and the second internal electrodes have a dimension of about 0.3 µm or more and about 1.0 µm or less in the laminating direction, and a total number of the first internal electrodes and the second internal electrodes is preferably 150 or more and 350 or less.

In a mounting substrate according to a preferred embodiment of the present invention, the multilayer ceramic capacitor preferably has a dimension of about 0.2 mm or more and about 0.7 mm or less in the length direction.

In a mounting substrate according to a preferred embodiment of the present invention, preferably, the first external electrode and the second electrode each includes a base electrode disposed just on the laminated body, and a plated layer disposed on the base electrode, and the plated layer includes Au.

In a mounting substrate according to a preferred embodiment of the present invention, the internal electrodes are preferably internal electrodes containing Cu.

In a mounting substrate according to a preferred embodiment of the present invention, the internal electrodes are preferably internal electrodes containing Ni.

In a mounting substrate according to a preferred embodiment of the present invention, the longest dimension is about 40 µm or less among dimensions in the laminating direction from the internal electrode located closest to the first principal surface in the laminating direction, among the first internal electrode and the second internal electrode, to the surface of the external electrode disposed on the side closer to the first principal surface, and from the internal electrode located closest to the second principal surface in the laminating direction, among the first internal electrode and the second internal electrode, to the surface of the external electrode disposed on the side closer to the second principal surface, and further, the longest dimension is about 40 µm or less among dimensions in a width direction from the surface of the first internal electrode or second internal electrode located closest to the first side surface in the width direction, among the first internal electrode and the second internal electrode, to the surface of the external electrode disposed on the side closer to the first side surface, and from the surface of the first internal electrode or second internal electrode located closest to the second side surface in the width direction, among the first internal electrode and the second internal electrode, to the surface of the external electrode disposed on the side closer to the second side surface.

Various preferred embodiments of the present invention provide a mounting substrate mounted with a multilayer ceramic capacitor which shows little change in insertion loss characteristics due to a difference in mounting attitude.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
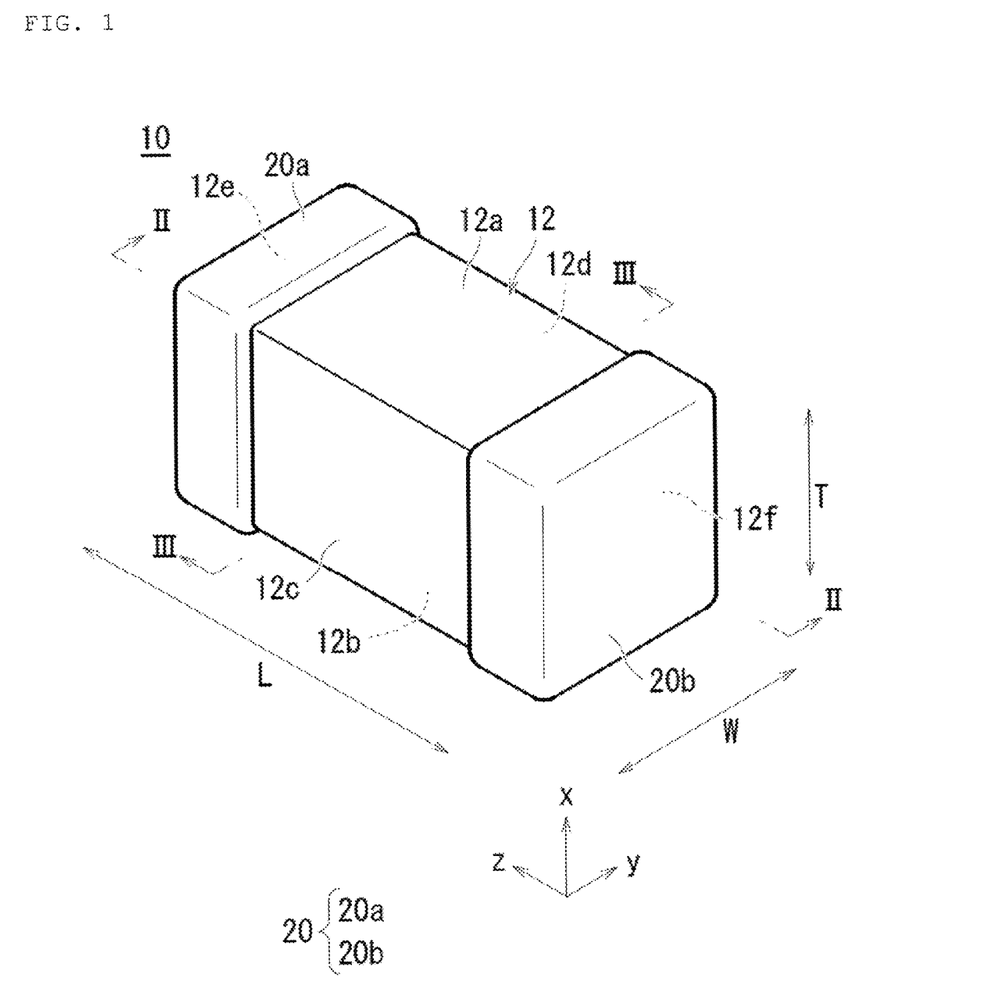
FIG. 1 is a perspective view illustrating an example of a multilayer ceramic capacitor that is used for a mounting substrate according to a preferred embodiment of the present invention.
Figure 2:
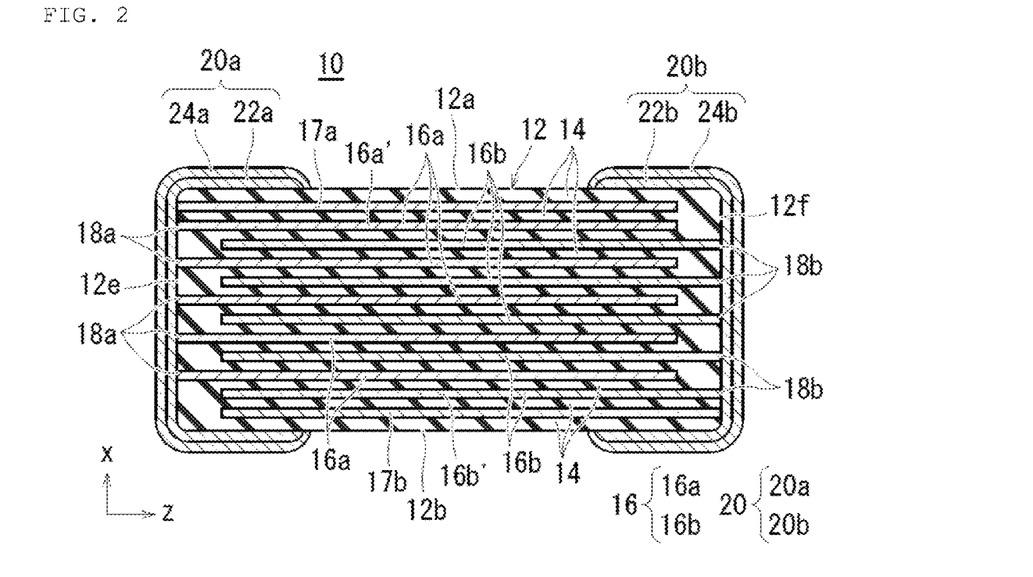
FIG. 2 is a cross-sectional view of the multilayer ceramic capacitor shown in FIG. 1 along the line II-II.
Figure 3:
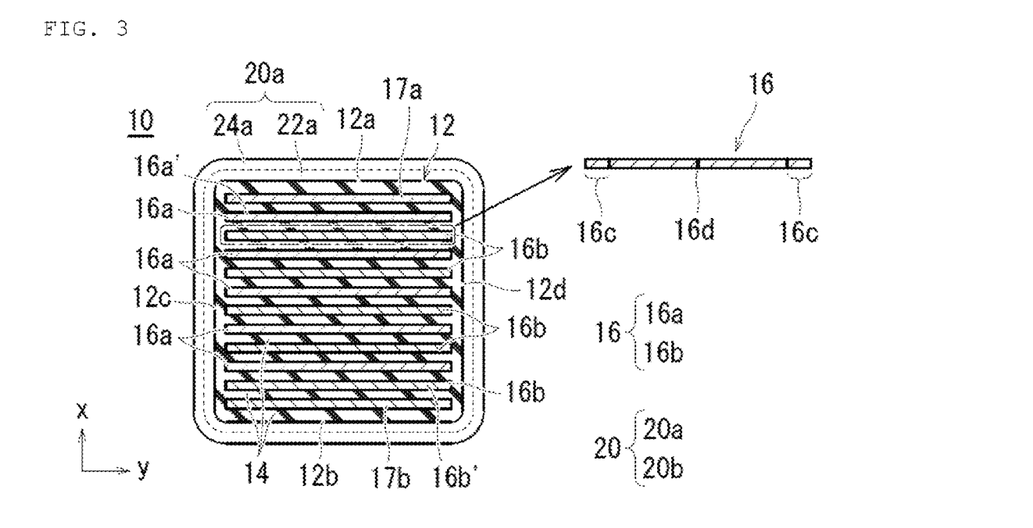
FIG. 3 is a cross-sectional view of the multilayer ceramic capacitor shown in FIG. 1 along the line III-III.

As shown in FIGS. 1, 2, and 3, a multilayer ceramic capacitor 10 includes, for example, a parallelepiped shape laminated body 12. The laminated body 12 includes a plurality of dielectric layers 14 laminated and a plurality of internal electrodes 16. Furthermore, the laminated body 12 includes a first principal surface 12a and a second principal surface 12b opposed in a laminating direction x, a first side surface 12c and a second side surface 12d opposed in a width direction y perpendicular or substantially perpendicular to the laminating direction x, and a first end surface 12e and a second end surface 12f opposed in a length direction z perpendicular or substantially perpendicular to the laminating direction x and the width direction y. The laminated body 12 preferably includes rounded corners and ridges.

Dielectric ceramics containing constituents such as, for example, $BaTiO_3$, $CaTiO_3$, $SrTiO_3$, and $CaZrO_3$ can be used as a dielectric material for the dielectric layers 14 of the laminated body 12. In addition, these constituents may be used with the addition thereto of a compound such as, for example, a Mn compound, a Mg compound, a Ca compound, a Fe compound, a Cr compound, a Co compound, or a Ni compound, and a rare-earth element compound. In addition, the dimension of one of the dielectric layers 14 is preferably, for example, about 0.5 μm or more and about 10 μm or less in the stacking direction x.

As shown in FIGS. 2 and 3, the laminated body 12 includes, as the plurality of internal electrodes 16, a plurality of first internal electrodes 16a and a plurality of second internal electrodes 16b which have, for example, a substantially rectangular shape. The plurality of first internal electrodes 16a and the plurality of second internal electrodes 16b are buried so as to be alternately disposed at regular intervals in the laminating direction x of the laminated body 12.

One end of the first internal electrode 16a includes an exposed surface 18a exposed at the first end surface 12e of the laminated body 12. One end of the second internal electrode 16b includes an exposed surface 18b exposed at the second end surface 12f of the laminated body 12. Specifically, the exposed surface 18a at one end of the first internal electrode 16a is exposed at the first end surface 12e of the laminated body 12. In addition, the exposed surface 18b at one end of the second internal electrode 16b is exposed at the second end surface 12f of the laminated body 12.

Furthermore, the first internal electrodes 16a and the second internal electrodes 16b are each parallel or substantially parallel to the first principal surface 12a and second principal surface 12b of the laminated body 12. In addition, the first internal electrodes 16a and the second internal electrodes 16b are opposed to each other with the dielectric layers 14 interposed therebetween in the laminating direction x of the laminated body 12.

The dimension in the laminating direction x is preferably, for example, about 0.3 μm or more and about 1.0 μm or less for each of the first internal electrodes 16a and second internal electrodes 16b.

In addition, the total number of the first internal electrodes 16a and second internal electrodes 16b is preferably 150 or more and 350 or less.

The first internal electrodes 16a and the second internal electrodes 16b can be each composed of, for example, a metal such as Ni, Cu, Ag, Pd, and Au, or an alloy containing one of the metals such as, for example, an Ag—Pd alloy. The first internal electrodes 16a and the second internal electrodes 16b are each preferably an internal electrode containing Cu or an internal electrode containing Ni.

In addition, the first internal electrodes 16a and the second internal electrodes 16b may each further include dielectric particles in the same composition system as the ceramic included in the dielectric layers 14.

It is to be noted that an auxiliary electrode 17a exposed at the first end surface 12e as with the first internal electrodes 16a may be located between the first internal electrode 16a' closest to the first principal surface 12a among the plurality of first internal electrodes 16a and the first principal surface 12a in the laminated body 12. Further, an auxiliary electrode 17b exposed at the second end surface 12f as with the second internal electrodes 16b may be located between the second internal electrode 16b' closest to the second principal surface 12b among the plurality of second internal electrodes 16b and the second principal surface 12b in the laminated body 12.

External electrodes 20 are provided on the first end surface 12e and second end surface 12f of the laminated body 12. The external electrodes 20 have a first external electrode 20a and a second external electrode 20b.

The first external electrode 20a is provided on the first end surface 12e of the laminated body 12. The first external electrode 20a covers the first end surface 12e of the laminated body 12, and extends from the first end surface 12e and partially cover the first principal surface 12a, the second principal surface 12b, the first side surface 12c, and the second side surface 12d. In this case, the first external electrode 20a is electrically connected to the exposed surfaces 18a of the first internal electrodes 16a. Further, when the auxiliary electrode 17a is formed, the first external electrode 20a is also electrically connected to the auxiliary electrode 17a. It is to be noted that there is no need for the external electrode 20a to be connected to the auxiliary electrode 17a.

The second external electrode 20b is provided on the second end surface 12f of the laminated body 12. The second external electrode 20b covers the second end surface 12f of the laminated body 12, and extends from the second end surface 12f and partially cover the first principal surface 12a, the second principal surface 12b, the first side surface 12c, and the second side surface 12d. In this case, the second external electrode 20b is electrically connected to the exposed surfaces 18b of the second internal electrodes 16b. Further, when the auxiliary electrode 17b is formed, the second external electrode 20b is also electrically connected to the auxiliary electrode 17b. It is to be noted that there is no need for the external electrode 20b to be connected to the auxiliary electrode 17b.

The first external electrode 20a includes a base electrode 22a and a plated layer 24a in order from the laminated body 12. Likewise, the second external electrode 20b includes a base electrode 22b and a plated layer 24b in order from the laminated body 12.

The base electrodes 22a and 22b each include at least one layer selected from baked layers and the like.

The baked layer includes glass composed of Si, and further includes, as a metal, for example, as least one selected from Cu, Ni, Ag, Pd, an Ag—Pd alloy, Au, and the like. The baked layer may include multiple layers. The baked layer is obtained by applying a conductive paste including glass and a metal to the laminated body 12 and baking the paste, and may be obtained by firing at the same time as the internal electrodes 16, or by baking after firing the internal electrodes 16.

The base electrodes 22a and 22b are each preferably about 25 μm or more and about 45 μm or less, for example, in the thickness of the thickest portion.

The plated layers 24a and 24b include, for example, as least one selected from Cu, Ni, Ag, Pd, an Ag—Pd alloy, Au, and the like.

A case in which the plated layers 24a and 24b are composed of Au is preferable, because of better mounting with a conductive adhesive, and improved bondability of wire bonding.

The plated layers 24a and 24b may each include multiple layers. In this case, the plated layers 24a and 24b preferably each include a two-layer structure including a Ni plated layer as a lower layer and a Sn plated layer as an upper layer.

This multilayer ceramic capacitor 10 preferably has, for example, a parallelepiped shape of about 0.6 mm in length L as the dimension in the length direction z, about 0.3 mm in width W as the dimension in the width direction y, and about 0.3 mm in thickness T as the dimension in the laminating direction x. The dimension of the multilayer ceramic capacitor 10 in the length direction z is preferably about 0.2 mm or more and about 0.7 mm or less. It is to be noted that each dimension includes a dimensional tolerance of about ±0.03 mm, for example.

In addition, in the multilayer ceramic capacitor 10, the first internal electrodes 16a and the second internal electrodes 16b are layered, and laminated in the laminating direction x of connecting the first principal surface 12a and second principal surface 12b of the laminated body 12 to each other.

Next, a non-limiting example of a method for manufacturing the multilayer ceramic capacitor 10 described above will be described.

First, ceramic green sheets 30 are prepared which include a ceramic material to form the dielectric layers 14 of the laminated body 12.

Figure 4:
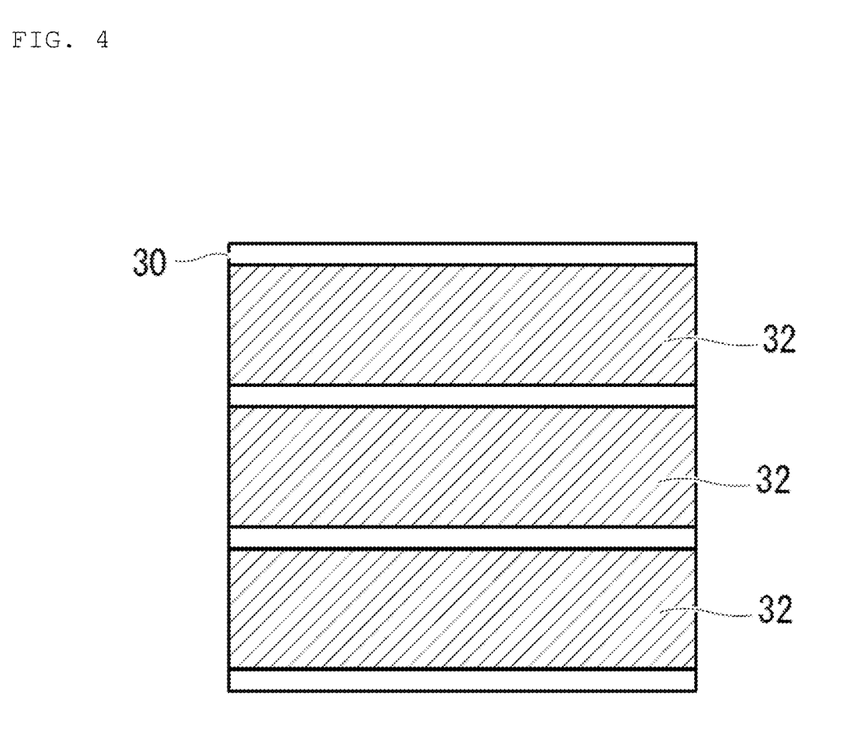
FIG. 4 is a schematic diagram illustrating a step for manufacturing the multilayer ceramic capacitor shown in FIG. 1.

Next, as shown in FIG. 4, a conductive paste is applied onto the ceramic green sheets 30, thus forming conductive patterns 32 in the form of a strip at regular intervals, which serve as internal electrodes or auxiliary electrodes. It is to be noted that the method of printing with the conductive paste can be achieved by various types of printing methods such as, for example, a screen printing method and a gravure printing method.

Figure 5A:
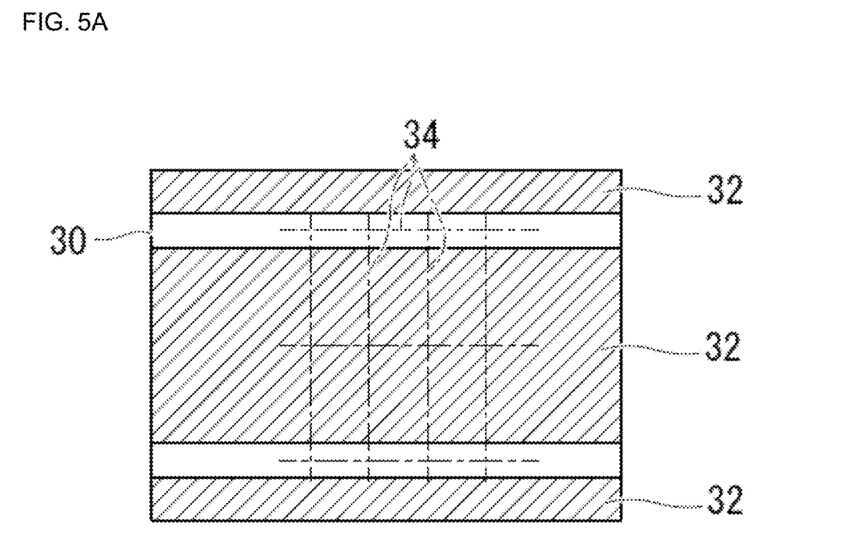
FIGS. 5A and 5B are schematic diagrams illustrating another step for manufacturing the multilayer ceramic capacitor shown in FIG. 1.
Figure 5B:
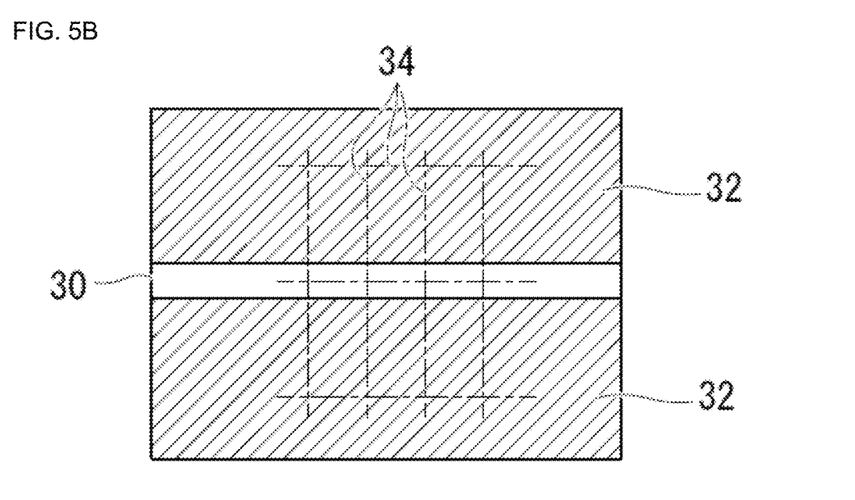

Then, first, the multiple ceramic green sheets 30 are stacked which have no conductive patterns 32 formed. Next, as for the multiple ceramic green sheets 30 with the conductive pattern 32 formed, as shown in FIGS. 5A and 5B, the multiple ceramic green sheets 30 with the conductive pattern 32 formed to serve as internal electrodes are stacked to be displaced at a certain pitch. Finally, the multiple ceramic green sheets 30 with no conductive patterns 32 formed are stacked, and pressed in the stacking direction by means of isostatic press or the like, thus preparing a laminated block. It is to be noted that the ceramic green sheets 30 with the conductive patterns 32 formed to serve as auxiliary electrodes and the nearest inner ceramic green sheet 30 with the conductive pattern 32 formed to serve as an internal electrode are stacked without any displacement.

Figure 6:
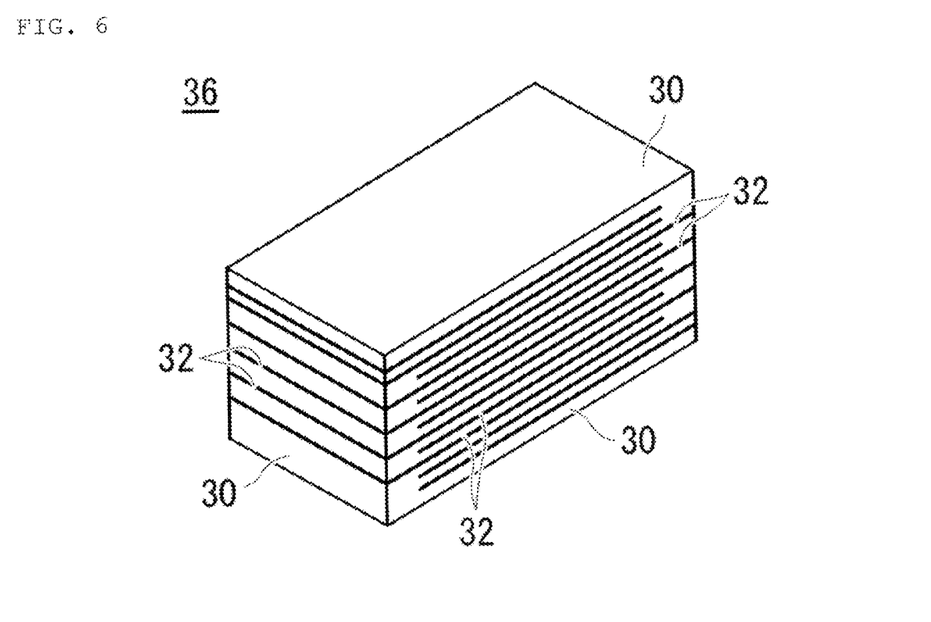
FIG. 6 is a perspective view illustrating a laminated chip for manufacturing the multilayer ceramic capacitor shown in FIG. 1.

Then, the laminated block was cut along imaginary lines 34 as shown in FIGS. 5A and 5B, thus forming a raw laminated chip 36 as shown in FIG. 6 from the laminated block. The laminated block can be cut with a dicing machine or a cutter. In this regard, the conductive patterns 32 are cut at a location to expose surfaces of the internal electrodes 16 in the width direction y, and ends of the internal electrodes 16 in the width direction y are thus aligned in the laminating direction x. It is to be noted that exposed surfaces of the auxiliary electrodes 17a and 17b in the width direction y are also aligned in the laminating direction x with the exposed surfaces of the internal electrodes 16 in the width direction y.

Figure 7:
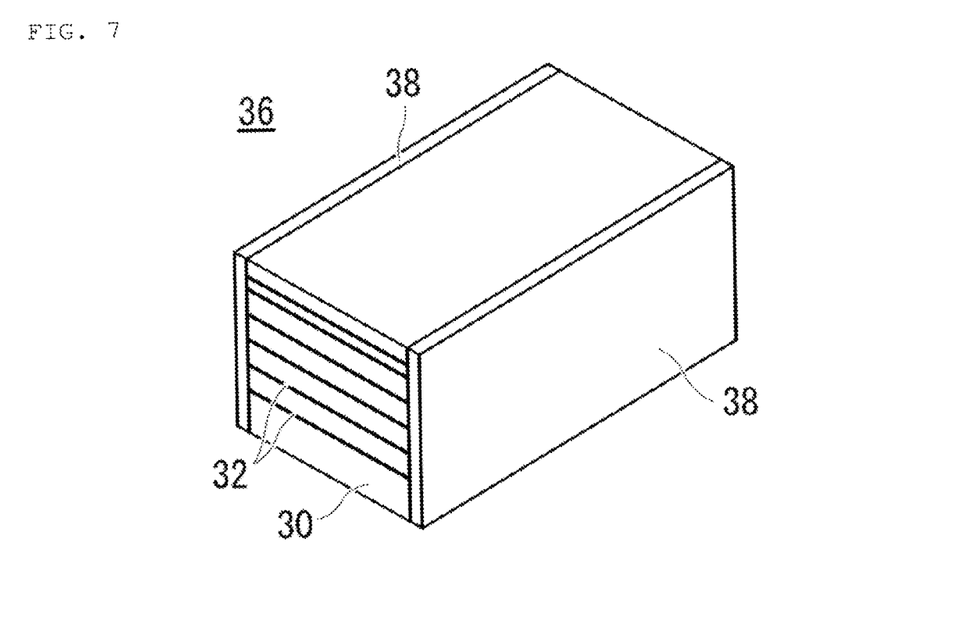
FIG. 7 is a perspective view illustrating yet another step for manufacturing the multilayer ceramic capacitor shown in FIG. 1.

As shown in FIG. 6, the conductive patterns 32 to serve as internal electrodes or auxiliary electrodes are exposed at both side surfaces of the laminated chip 36. Therefore, as shown in FIG. 7, both of the side surfaces of the laminated chip 36 are covered respectively with ceramic green sheets 38 to serve as dielectrics, so as to cover the conductive patterns 32 exposed at both of the side surfaces of the laminated chip 36. Instead, ceramic slurry to serve as dielectrics may be applied to both of the side surfaces of the laminated chip 36. It is to be noted that the sheets covering both of the side surfaces of the laminated chip 36 just have to keep the internal electrodes from being exposed to the atmosphere, and the internal electrodes just have to be covered with sheets that keep an insulating property, other than dielectrics.

It is to be noted that the laminated chip 36 with the conductive patterns 32 covered in such a manner may be thereafter subjected to barrel polishing or the like, thus providing rounded corners and ridges.

Then, the raw laminated chip 36 is subjected to firing. In this firing step, the dielectric layers 14, the first internal electrodes 16a, the second internal electrodes 16b, and the auxiliary electrodes 17a and 17b are subjected to firing. The firing temperature can be set appropriately, depending on the ceramic material used and the type of the conductive paste. The firing temperature can be, for example, about 900° C. or higher and about 1300° C. or lower.

Then, a conductive paste is applied by a method such as dipping to both ends of the fired laminated chip, that is, both ends of the laminated body 12.

Next, the conductive paste applied to the laminated body 12 is subjected to hot-air drying, for example, for 10 minutes at 60° C. or higher and 180° C. or lower.

Thereafter, the dried conductive paste is baked to form baked layers for the base electrodes 22a and 22b.

Then, by electrolytic plating, the plated layer 24a is formed on the base electrode 22a, and the plated layer 24b is formed on the base electrode 22b.

In the way described above, the multilayer ceramic capacitor 10 may be manufactured.

Next, a mounting substrate 100A will be described which is obtained by mounting the multilayer ceramic capacitor 10 shown in FIG. 1.

Figure 8:
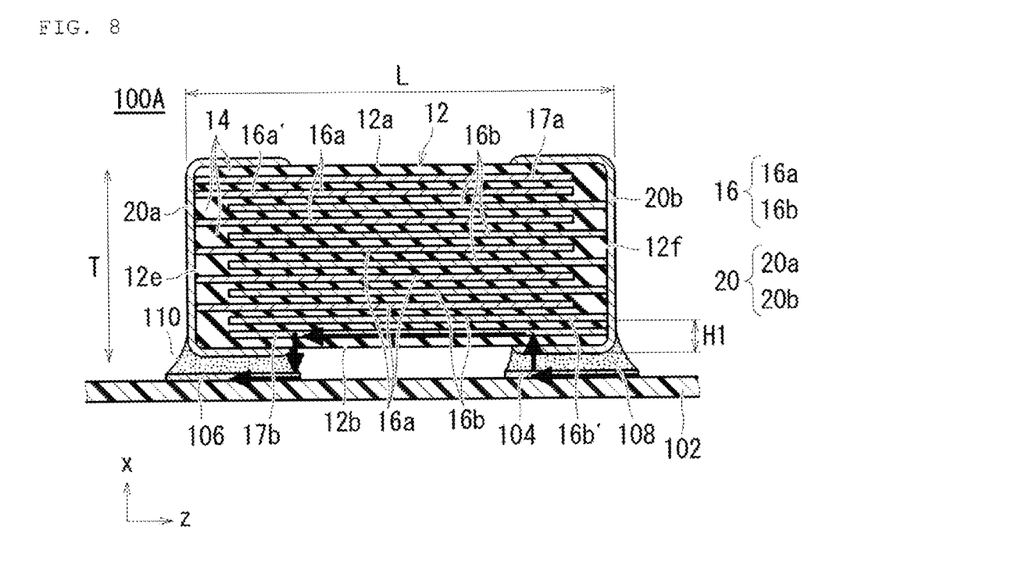
FIG. 8 is a cross-sectional view of a mounting substrate where the multilayer ceramic capacitor shown in FIG. 1 includes internal electrodes parallel or substantially parallel to a mounting surface.

FIG. 8 is a cross-sectional view of the mounting substrate 100A obtained when the internal electrodes 16 of the multilayer ceramic capacitor 10 shown in FIG. 1 are parallel or substantially parallel to the mounting surface for mounting the capacitor.

The mounting substrate 100A shown in FIG. 8 includes a base substrate 102. On one principal surface of the base substrate 102, an output electrode 104 and an input electrode 106 are located at a distance that is almost equal to the interval between the first external electrode 20a and second external electrode 20b of the multilayer ceramic capacitor 10.

The output electrode 104 refers to an electrode that outputs signals including a frequency region of 10 GHz or higher. Therefore, for example, an output terminal of a trans-impedance amplifier (not shown) mounted on the base substrate 102 is electrically connected to the output electrode 104, for example, through a via-hole conductor in the base substrate 102. The output from the trans-impedance amplifier is 60 GHz or lower, which has a flow of signals including frequencies in a low-frequency region to a high-frequency region.

The input electrode 106 refers to an electrode that inputs signals including frequencies in a frequency region of 10 GHz or higher. Therefore, for example, an input terminal of an IC (not shown) mounted on the base substrate 102 is electrically connected to the input electrode 106, for example, through a via-hole conductor in the base substrate 102.

The multilayer ceramic capacitor 10 as a coupling capacitor is connected to the output electrode 104 and the input electrode 106 in order to input, to the IC, signals output from the trans-impedance amplifier. In this case, the second external electrode 20b of the multilayer ceramic capacitor 10 is electrically connected to the output electrode 104 with a solder fillet 108. Further, the first external electrode 20a of the multilayer ceramic capacitor 10 is electrically connected to the input electrode 106 with a solder fillet 110.

For the mounting substrate 100A shown in FIG. 8, the multilayer ceramic capacitor 10 is mounted such that the internal electrodes 16 are parallel or substantially parallel to the mounting surface. In this case, the multilayer ceramic capacitor 10 is mounted such that the second principal surface 12b of the laminated body 12 is opposed to the mounting surface of the base substrate 102.

Figure 9:
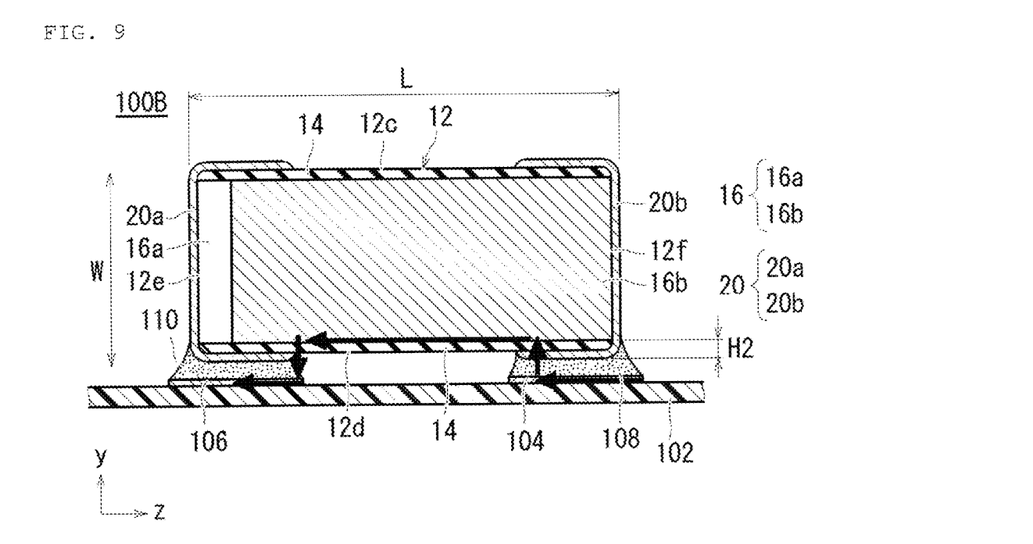
FIG. 9 is a cross-sectional view of a mounting substrate where the multilayer ceramic capacitor shown in FIG. 1 includes internal electrodes perpendicular or substantially perpendicular to a mounting surface.

FIG. 9 is a cross-sectional view of a mounting substrate 100B where the internal electrodes 16 of the multilayer ceramic capacitor 10 shown in FIG. 1 are perpendicular or substantially perpendicular to a mounting surface for mounting.

The mounting substrate 100B shown in FIG. 9 differs in the direction of mounting the multilayer ceramic capacitor 10, as compared with the mounting substrate 100A shown in FIG. 8.

For the mounting substrate 100B shown in FIG. 9, the multilayer ceramic capacitor 10 is mounted such that the internal electrodes 16 are perpendicular or substantially perpendicular to the mounting surface. In this case, the multilayer ceramic capacitor 10 is mounted such that the second side surface 12d of the laminated body 12 is opposed to the mounting surface of the base substrate 102.

Figure 10:
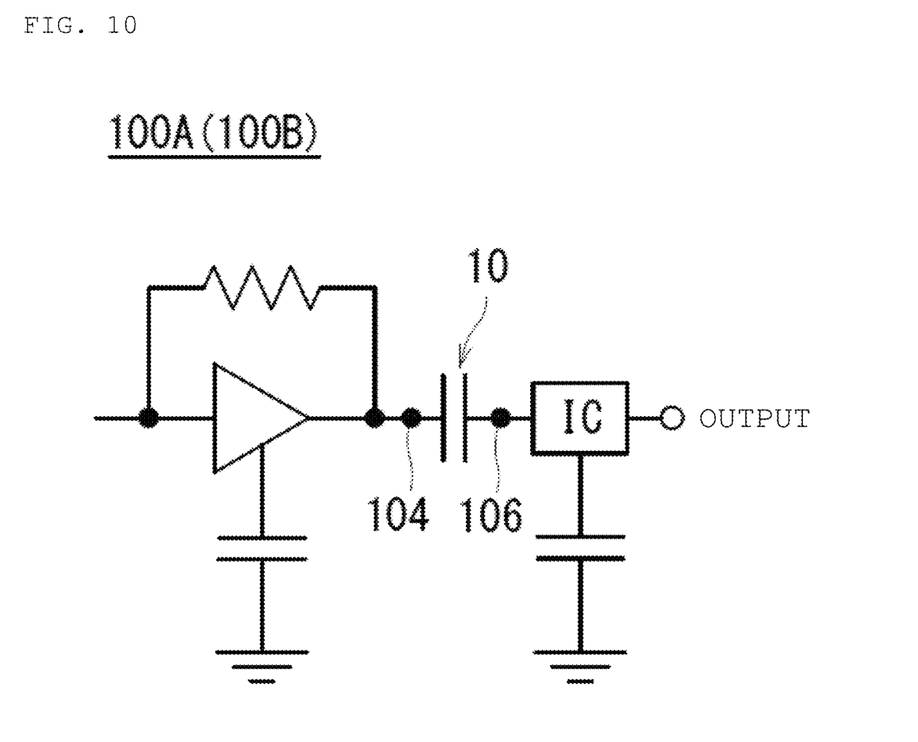
FIG. 10 is a circuit diagram for each of the mounting substrates shown in FIGS. 8 and 9.

The mounting substrate 100A shown in FIG. 8 and the mounting substrate 100B shown in FIG. 9 each include a circuit as shown in FIG. 10

For each of the multilayer ceramic capacitor 10 mounted on the mounting substrate 100A shown in FIG. 8 and the mounting substrate 100B shown in FIG. 9, as viewed in cross sections including the external electrodes 20 on the first principal surface 12a, the second principal surface 12b, the first side surface 12c, and the second side surface 12d, and including the laminating direction x and the width direction y, the internal electrodes 16 are arranged such that the longest dimension is about 40 μm or less among dimensions in the laminating direction x from the first internal electrode 16a' located closest to the first principal surface 12a in the laminating direction x, among the plurality of internal electrodes 16, to the surface of the external electrode 20 on the side closer to the first principal surface 12a.

Likewise, the internal electrodes 16 are arranged such that the longest dimension is about 40 μm or less among dimensions in the laminating direction x from the second internal electrode 16b' located closest to the second principal surface 12b in the laminating direction x, among the plurality of internal electrodes 16, to the surface of the external electrode 20 on the side closer to the second principal surface 12b. In addition, the internal electrodes 16 are arranged such that the longest dimension is about 40 μm or less among dimensions in the width direction y from the surface of the internal electrode 16 located closest to the first side surface 12c in the width direction y, among the plurality of internal electrodes 16, to the surface of the external electrode 20 closer to the first side surface 12c. Likewise, the internal electrodes 16 are arranged such that the longest dimension is about 40 μm or less among dimensions in the width direction y from the surface of the internal electrode 16 located closest to the second side surface 12d in the width direction y, among the plurality of internal electrodes 16, to the surface of the external electrode 20 on the side closer to the second side surface 12d.

More specifically, as shown in FIG. 8, the internal electrodes 16 are arranged, for example, such that a dimension H1 in the laminating direction x is about 40 μm or less between the internal electrode 16 and the surface of the external electrode 20, whereas as shown in FIG. 9, the internal electrodes 16 are arranged, for example, such that a dimension H2 in the width direction y is about 40 μm or less between the internal electrode 16 and the surface of the external electrode 20. It is to be noted that when an auxiliary electrode is formed, the distance from the auxiliary electrode preferably is adopted.

As just described, it is possible to shorten the signal flow pathway from the output electrode 104 disposed for the mounting substrate 100A or the mounting substrate 100B to the multilayer ceramic capacitor 10 and the signal flow pathway from the multilayer ceramic capacitor 10 to the input electrode 106. Accordingly, the equivalent series inductance is effectively reduced. This appears significantly at a signal frequency of 10 GHz or more, and more significantly at 20 GHz or more.

It is to be noted that in this regard, the external electrode 20 may include the base electrode and a plated layer disposed on the base electrode, but the dimension or distance to the surface of the external electrode 20 includes no plated layer of Sn melded by soldering.

The thickness and stacking number of the ceramic green sheets 30 with no internal electrode provided thereon, the thickness of the ceramic green sheet 38, and the like just have to be adjusted for the dimensions and distances as described above.

Therefore, the mounting substrate 100A shown in FIG. 8 and the mounting substrate 100B shown in FIG. 9 each define and function as a mounting substrate mounted with the multilayer ceramic capacitor 10 which less varies in insertion loss characteristics.

In this regard, an example of a multilayer ceramic capacitor that is used for a mounting substrate according to a preferred embodiment of the present invention will be compared with an example of a multilayer ceramic capacitor that is used for a conventional mounting substrate.

Figure 11:
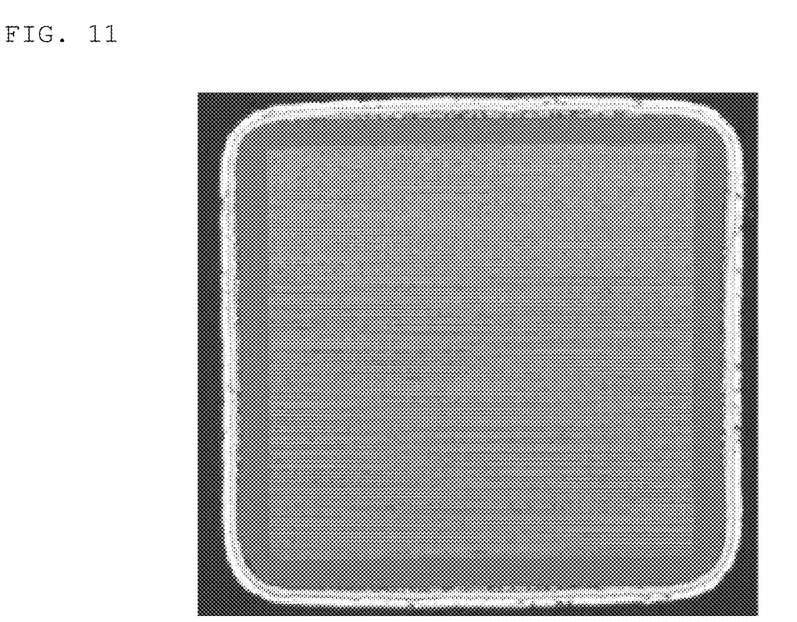
FIG. 11 is an electron micrograph of a cross section of an example of a multilayer ceramic capacitor that is used for a mounting substrate according to a preferred embodiment of the present invention.
Figure 12:
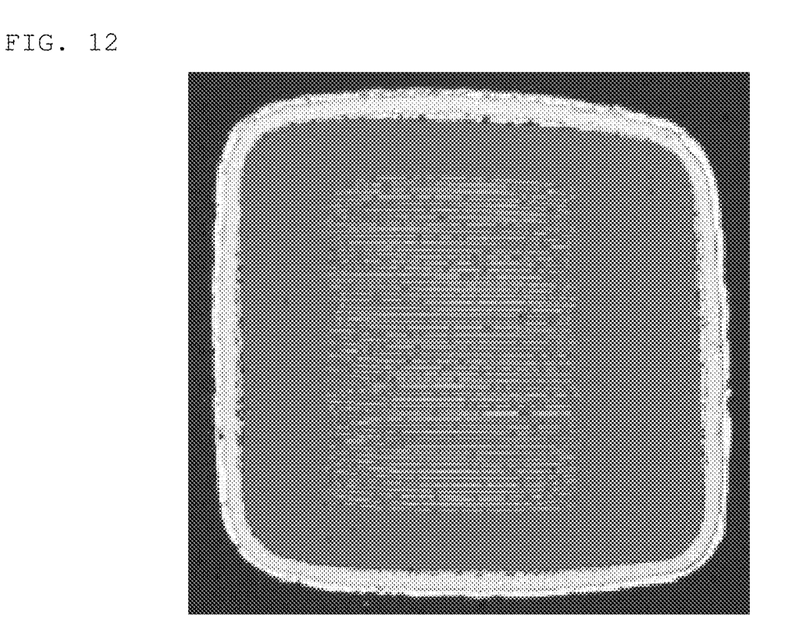
FIG. 12 is an electron micrograph of a cross section of an example of a multilayer ceramic capacitor that is used for a conventional mounting substrate.

FIG. 11 shows a photographic image, under an optical microscope, of a cross section of an example of a multilayer ceramic capacitor that is used for a mounting substrate according to a preferred embodiment of the present invention, whereas FIG. 12 shows a photographic image, under an optical microscope, of a cross section of an example of a multilayer ceramic capacitor that is used for a conventional mounting substrate.

In FIGS. 11 and 12, the outermost white section represents an external electrode, the white section on the inner side of the external electrode represents an outer shell of a laminated body, and the multilayer white section within the laminated body represents internal electrodes. The other gray section represents dielectric layers.

As is clear from FIGS. 11 and 12, the internal electrodes are closer to the external electrode in the example of the multilayer ceramic capacitor used for a mounting substrate according to a preferred embodiment of the present invention, than in the example of the multilayer ceramic capacitor used for a conventional mounting substrate.

In the mounting substrate 100A shown in FIG. 8, a flow of signals has a wide range of frequencies up to 60 GHz, in particular, at 10 GHz or higher, the advantageous effects of various preferred embodiments of the present invention are achieved, and at 20 GHz or higher, a greater effect is achieved. In FIG. 8, the arrows represent a low of signals. The advantageous effects according to various preferred embodiments of the present invention are achieved with signals at 10 GHz or higher, and becomes more significant at 20 GHz or higher.

In the case of the mounting substrate 100A shown in FIG. 8, in particular, the total value of the thickness of the external electrode 20 on the side closer to the second principal surface 12b and the distance between the internal electrode 16 closest to the second principal surface 12b and the external electrode 20 is about 40 μm or less, and the equivalent series inductance is thus reduced.

Also in the mounting substrate 100B shown in FIG. 9, as with the mounting substrate 100A shown in FIG. 8, a flow of signals has a wide range of frequencies up to 60 GHz, in particular, at 10 GHz or higher, the advantageous effects of various preferred embodiments of the present invention are achieved, and at 20 GHz or higher, greater effects are achieved. In FIG. 9, the arrows represent a low of signals. The advantageous effects according to various preferred embodiments of the present invention are achieved with signals at 10 GHz or higher, and become more significant at 20 GHz or higher.

In the case of the mounting substrate 100B shown in FIG. 9, in particular, the total value of the thickness of the external electrode 20 on the side closer to the second side surface 12d and the distance between an end of the internal electrode 16 closest to the second side surface 12d and the external electrode 20 is about 40 μm or less, and the equivalent series inductance is thus reduced.

Furthermore, in the case of the mounting substrate 100B shown in FIG. 9, the surfaces of the internal electrodes 16 in the width direction y are located at 0 μm or more and about 2 μm or less from the side surface of the laminated body 12 when the section of the dielectric layers 14 composed of the ceramic green sheets 38 is removed, and the surfaces of the internal electrodes 16 in the width direction y are almost aligned in the laminating direction x. The thickness of the ceramic green sheet 38 and the like just have to be adjusted in order to adjust the distances between the surfaces of the internal electrodes 16 in the width direction y and the side surface of the laminated body 12.

Therefore, as shown in FIG. 9, when the internal electrodes 16 are disposed to be perpendicular or substantially perpendicular to the mounting surface, signals in a high-frequency region mainly pass near the surfaces of the internal electrodes 16 in the width direction y, and the variation in equivalent series inductance are reduced between multilayer ceramic capacitors 10, because the surfaces are almost aligned in the laminating direction x. Accordingly, the variation in insertion loss characteristics is reduced.

More specifically, a common multilayer ceramic capacitor is used for a conventional mounting substrate, and in the case of such a common multilayer ceramic capacitor, the location of the surface of the internal electrode in the width direction varies in the laminating direction x, because of displacement in stacking. It is difficult to control the variation between multilayer ceramic capacitors, and a difference in equivalent series inductance is produced between the multilayer ceramic capacitors. More specifically, when the surface of the internal electrode in the width direction varies in the laminating direction, the distance accordingly varies between a width-direction end of the internal electrode through which signals in a high-frequency region pass and the mounting surface, thus leading to variations in equivalent series inductance. Therefore, there are variations in insertion loss characteristics.

In contrast, in the case of the mounting substrate 100B shown in FIG. 9, ends of the internal electrodes 16 in the width direction y are aligned in the laminating direction x, and thus, the equivalent series inductance is less likely to vary, and insertion loss characteristics are less likely to vary. This appears significantly at a signal frequency of 10 GHz or more, and more significantly at 20 GHz or more.

In this regard, again referring to FIGS. 11 and 12, the ends of the internal electrodes in the width direction are aligned in the laminating direction in the example of the multilayer ceramic capacitor used for a mounting substrate according to a preferred embodiment of the present invention, more than in the example of the multilayer ceramic capacitor used for a conventional mounting substrate.

In the case of the mounting substrate 100A shown in FIG. 8 and the mounting substrate 100B shown in FIG. 9, when the multilayer ceramic capacitor is mounted parallel or substantially parallel to the mounting surface, the differences are about 10 μm or less among the longest dimension among dimensions in the laminating direction x from the first internal electrode 16a' to the surface of the external electrode 20 on the side closer to the first principal surface 12a; the longest dimension among dimensions in the laminating direction x from the second internal electrode 16b' to the surface of the external electrode 20 on the side closer to the second principal surface 12b; the longest dimension among dimensions in the width direction y from the surface of the internal electrode 16 located closest to the first side surface 12c, among the plurality of internal electrodes 16, to the surface of the external electrode 20 on the side closer to the first side surface 12c; and the longest dimension among dimensions in the width direction y from the surface of the internal electrode 16 located closest to the second side surface 12d, among the plurality of internal electrodes 16, to the surface of the external electrode 20 on the side closer to the second side surface 12d. Thus, even when the multilayer ceramic capacitor 10 is mounted in any orientation, the equivalent series inductance is able to be lowered, and stable insertion loss characteristic is achieved in a higher frequency region. This appears significantly at a signal frequency of 10 GHz or more, and more significantly at 20 GHz or more. Therefore, the mounting substrate 100A shown in FIG. 8 and the mounting substrate 100B shown in FIG. 9 each define and function as a mounting substrate mounted with the multilayer ceramic capacitor 10 which less varies in insertion loss characteristics.

It is to be noted that in this regard, the external electrode 20 may include the base electrode and a plated layer disposed on the base electrode, but the dimension to the surface of the external electrode 20 includes no plated layer of Sn melded by soldering.

The thickness and stacking number of the ceramic green sheets 30, the thickness of the ceramic green sheet 38, and the like just have to be adjusted for the difference between dimensions as described above.

In the mounting substrate 100A shown in FIG. 8 and the mounting substrate 100B shown in FIG. 9, the dimension in the laminating direction x for each individual electrode of the plurality of internal electrode 16 is preferably about 0.3 μm or more and about 1.0 μm or less, and the total number of the plurality of internal electrodes 16 is 150 or more and 350 or less.

When the dimension of the internal electrode 16 in the laminating direction x is increased to more than about 1.0 μm, there is a need to reduce the total number of internal electrodes 16 in order to prevent the increase in the size of the multilayer ceramic capacitor 10, and the electrostatic capacitance will be decreased. The decreased electrostatic capacitance makes high-frequency signals less likely to pass. On the other hand, the fact that the dimension of the internal electrode 16 in the laminating direction x is smaller than about 0.3 μm means the reduced area of the internal electrode 16 covering the dielectric layer 14, and thus the reduced pathway through which high-frequency signals pass, resulting in an increase in equivalent series resistance. The increased equivalent series resistance makes signals in a high-frequency region less likely to pass.

In addition, when the total number of the internal electrodes 16 is more than 350, it is not possible to suppress the increase in the size of the multilayer ceramic capacitor 10. On the other hand, when the total number of the internal electrodes 16 is less than 150, the electrostatic capacitance is decreased, thus making high-frequency signals less likely to pass.

In each of the mounting substrate 100A shown in FIG. 8 and the mounting substrate 100B shown in FIG. 9, the insertion loss is determined by combined factors principally including the equivalent series inductance and the equivalent series resistance. Therefore, the increase in equivalent series resistance is able to be prevented by adjusting the dimension in the laminating direction x for each individual electrode of the plurality of internal electrode 16 to about 0.3 μm or more and about 1.0 μm or less, and adjusting the total number of the plurality of internal electrodes 16 to 150 or more and 350 or less. In a high-frequency region, the equivalent series resistance has an influence on the insertion loss, and degradation of insertion loss is able to be prevented by keeping the equivalent series resistance in the high-frequency region low.

In each of the mounting substrate 100A shown in FIG. 8 and the mounting substrate 100B shown in FIG. 9, the length L that is a dimension of the multilayer ceramic capacitor 10 in the length direction z thereof has an influence on the insertion loss. As the dimension is shorter in the length direction z of the multilayer ceramic capacitor 10, the equivalent series inductance is decreased, and there is thus a tendency to lower the insertion loss. Therefore, the dimension of the multilayer ceramic capacitor 10 in the length direction z thereof is preferably about 0.6 mm or less. When this dimension is more than about 0.6 mm, the pathway through which signals pass is longer, thus increasing the equivalent series inductance.

In each of the mounting substrate 100A shown in FIG. 8 and the mounting substrate 100B shown in FIG. 9, when the dimension of the multilayer ceramic capacitor 10 in the length direction z thereof is about 0.2 mm or more and about 0.7 mm or less, the wideband multilayer ceramic capacitor 10 is able to be mounted which has a smaller size.

It is to be noted that the dimension of the multilayer ceramic capacitor 10 in the length direction z thereof includes the thickness of the external electrode 20.

In each of the mounting substrate 100A shown in FIG. 8 and the mounting substrate 100B shown in FIG. 9, the first external electrode 20a includes a base electrode 22a disposed just on the laminated body 12, and a plated layer 24a disposed on the base electrode 22a. The second external electrode 20b includes a base electrode 22b disposed just on the laminated body 12, and a plated layer 24b disposed on the base electrode 22b. In addition, when the plated layers 24a and 24b are composed of Au, it becomes possible to mount the multilayer ceramic capacitor 10 with a conductive adhesive, and also by wire bonding.

In each of the mounting substrate 100A shown in FIG. 8 and the mounting substrate 100B shown in FIG. 9, when the internal electrodes 16 are internal electrodes containing Cu, the insertion loss is able to be reduced, and frequency characteristics are favorable in a high-frequency region.

In each of the mounting substrate 100A shown in FIG. 8 and the mounting substrate 100B shown in FIG. 9, when the internal electrodes 16 are internal electrodes containing Ni, the degree of freedom of selecting a dielectric material for the laminated chip is increased for firing the laminated chip, because Ni has a high melting point.

In each of the mounting substrate 100A shown in FIG. 8 and the mounting substrate 100B shown in FIG. 9, the dimension of the internal electrode 16 in the laminating direction x has an almost uniform magnitude in the width direction y. Specifically, when a portion of about 5 µm inside in the width direction y from an end of the internal electrode 16 in the width direction y is referred to as an end portion 16c (see FIG. 3) of the internal electrode 16, the difference between the dimension of the width-direction y inner end portion 16c of the internal electrode 16 in the laminating direction x and the dimension of a width-direction y central portion 16d (see FIG. 3) of the internal electrode 16 in the laminating direction x falls within about ±5% with reference to the dimension of the central portion 16d in the laminating direction x.

As described above, when the internal electrodes 16 are disposed in a direction perpendicular or substantially perpendicular to the mounting surface, a high-frequency component passes through end portions 16c of the internal electrodes 16.

In general, in a multilayer ceramic capacitor, the proportion of a dielectric layer covered with a central portion of the internal electrode in a width direction is higher than that of a dielectric layer covered with an end portion of the internal electrode in the width direction.

However, as in the multilayer ceramic capacitor 10 used for the mounting substrate 100A shown in FIG. 8 and the mounting substrate 100B shown in FIG. 9, the fact that the size of the internal electrode 16 is almost uniform in thickness means that the proportion of the internal electrode 16 covering the dielectric layer 14 is almost constant, and that the proportion of the internal electrode 16 covering the dielectric layer 14 is higher even at the end portions 16c. More specifically, it means that the equivalent series resistance is decreased at the end portions 16c through which signals in a high-frequency region likely to pass, and the decrease in insertion loss in the high-frequency region is able to be prevented.

It is to be noted that when the total number of the internal electrodes 16 is less than 150, in particular, when the internal electrodes 16 are disposed in a vertical direction, the plurality of the internal electrodes 16 through which signals in a high-frequency region can pass will be decreased, thus increasing the insertion loss in the high-frequency region.

The multilayer ceramic capacitor 10 used for the mounting substrate 100A shown in FIG. 8 and the mounting substrate 100B shown in FIG. 9 preferably has electrostatic capacitance of about 0.1 µF or higher. The electrostatic capacitance of the multilayer ceramic capacitor 10 below about 0.1 µF makes signals in a low-frequency region less likely to pass. It is to be noted that when the electrostatic capacitance of the multilayer ceramic capacitor 10 is higher than about 1 µF, the equivalent series resistance can be kept lower because of the increased number of internal electrodes, and furthermore, the case of about 0.1 µF or more is more preferred because, due to the high electrostatic capacitance, signals are made more likely to pass in a low-frequency region, and more likely to be applied to a wide band. It is to be noted that the electrostatic capacitance refers to electrostatic capacitance at a temperature of 25° C. in accordance with the EIA standards.

The plurality of the internal electrodes 16 described above and the dimension thereof in the laminating direction x are measured under an optical microscope, while the internal electrodes 16 are exposed by polishing a central portion of the laminated body 12 in the length direction z so as to expose a cross section including the width direction y and the laminating direction x.

It is to be noted that for the measurement, a surface treatment is carried out so as not to produce polishing shear drop from the internal electrodes 16. In addition, in measuring the dimension of the internal electrode 16 in the laminating direction x, the part with the internal electrode 16 lost is excluded from the measurement. In this regard, as for the dimension of the internal electrode 16 in the laminating direction x, the average value for five measurement points evenly extracted in the width direction y evenly from each of five layers in the laminating direction x is regarded as the dimension of the internal electrode 16 in the laminating direction x.

For the plurality of the internal electrodes 16, the plurality of the internal electrodes 16 exposed in the cross section is measured. It is to be noted that the auxiliary electrodes 17a and 17b for upper and lower layers are not included in the plurality of the internal electrodes 16.

In addition, the other respective dimensions and distances can be confirmed by polishing the multilayer ceramic capacitor 10 mounted and the base substrate 102 together to a cross section, and observing the cross section with an optical microscope.

Mounting substrates according to an example and Comparative Examples 1, 2, and 3 were each prepared.

In accordance with the example, the mounting substrate was prepared where internal electrodes of a multilayer ceramic capacitor were disposed in parallel or substantially parallel to a mounting surface as shown in FIG. 8, and the mounting substrate was prepared where internal electrodes of a multilayer ceramic capacitor were disposed perpendicular or substantially perpendicular to a mounting surface as shown in FIG. 9.

In accordance with Comparative Example 1, the mounting substrate was prepared where internal electrodes of a multilayer ceramic capacitor were disposed in parallel or substantially parallel to a mounting surface.

In accordance with Comparative Example 2, the mounting substrate was prepared where internal electrodes of a multilayer ceramic capacitor were disposed perpendicular or substantially perpendicular to a mounting surface.

In accordance with Comparative Example 3, the mounting substrate was prepared where internal electrodes of a multilayer ceramic capacitor were disposed in parallel or substantially parallel to a mounting surface, and the mounting substrate was prepared where internal electrodes of a multilayer ceramic capacitor were disposed perpendicular or substantially perpendicular to a mounting surface.

Table 1 shows the size, electrostatic capacitance, dimension in a width direction, and dimension in a laminating direction for each multilayer ceramic capacitor used for each of the mounting substrates according to the example and Comparative Examples 1, 2, and 3.

TABLE 1

| electrostatic capacitance | The dimension in a width direction | The dimension in a laminating direction | The insertion loss (dB): evaluation | | | |
|---|---|---|---|---|---|---|
| | | | 10 GHz | 20 GHz | 30 GHz | 35 GHz |
| 1.0 μF | 35 μm | 35 μm | 0.04 dB: ○ | 0.15 dB: ○ | 0.10 dB: ○ | 0.18 dB: ○ |
| 0.1 μF | 65 μm | 47 μm | 0.09 dB: ○ | 0.43 dB: ○ | 0.50 dB: ○ | 0.73 dB: x |
| 0.1 μF | 65 μm | 47 μm | 0.14 dB: ○ | 0.60 dB: ○ | 0.82 dB: ○ | 1.13 dB: ○ |
| 0.01 μF | 92 μm | 79 μm | 0.36 dB: ○ | 0.94 dB: ○ | 1.22 dB: x | 1.22 dB: ○ |

In this regard, the dimension in the width direction represents the distance in the width direction of the multilayer ceramic capacitor, from a width-direction end of the internal electrode closest to an electrode formed on a base substrate to the surface of an external electrode. It is to be noted that the internal electrodes include no auxiliary electrode. In addition, the distance to the surface of the external electrode refers to the distance to the surface of a base electrode of the external electrode, excluding a plated layer.

In addition, the dimension in the laminating direction represents the distance in the laminating direction of the multilayer ceramic capacitor, from the internal electrode closest to the electrode on the base substrate to the surface of the external electrode. Also in this case, the internal electrodes include no auxiliary electrode. In addition, the distance to the surface of the external electrode refers to the distance to the surface of a base electrode of the external electrode, excluding a plated layer.

Then, for each of the mounting substrates, insertion loss characteristics with respect to signal frequency were measured with the use of a high-frequency probe and a network analyzer. In this case, the gains (dB) at each frequency of 10 GHz, 20 GHz, 30 GHz, and 35 GHz were measured as the insertion loss characteristics. Table 1 also shows these measurement results. It is to be noted that among the measurement results of the two types of mounting substrates that differ in internal electrode arrangement, lower measurement results are shown as the measurement results of the example. In addition, among the measurement results of the two types of mounting substrates that differ in internal electrode arrangement, higher measurement results are shown as the measurement results of Comparative Example 3.

For evaluations of the measurement results shown in FIG. 1, when the internal electrodes are either perpendicular or substantially perpendicular or parallel or substantially parallel to the mounting surface, a case of higher than about 0.5 dB in insertion loss characteristics is denoted by "X", whereas a case of about 0.5 dB or less therein is denoted by "0". It is to be noted that the criterion of about 0.5 dB is based on the usage of mounting substrates.

From the measurement results and evaluations shown in Table 1, it is determined that the mounting substrates according to Comparative Examples 1, 2, and 3 all fail to achieve insertion loss characteristics of about 0.5 dB or lower at all of the frequencies of 10 GHz, 20 GHz, 30 GHz, and 35 GHz, whereas the mounting substrates according to the example achieve insertion loss characteristics of about 0.5 dB or lower at all of the frequencies of 10 GHz, 20 GHz, 30 GHz, and 35 GHz.

While the mounting substrates 100A and 100B described above have the multilayer ceramic capacitor 10 mounted such that the second principal surface 12b or second side surface 12d of the laminated body 12 is opposed to the mounting surface of the base substrate 102, the multilayer ceramic capacitor 10 may be mounted such that the first principal surface 12a or first side surface 12c of the laminated body 12 is opposed to the mounting surface of the base substrate 102.

In addition, while the mounting substrates 100A and 100B described above have the first external electrode 20a of the multilayer ceramic capacitor 10 connected to the input electrode 106, and the second external electrode 20b thereof connected to the output electrode 104, the first external electrode 20a of the multilayer ceramic capacitor 10 may be connected to the output electrode 104, whereas the second external electrode 20b thereof may be connected to the input electrode 106.

Furthermore, while the mounting substrates 100A and 100B described above have one first internal electrode 16a and one second internal electrode 16b disposed outside in the laminating direction x of the laminated body 12 of the multilayer ceramic capacitor 10, two first internal electrodes 16a may be disposed outside, or two second internal electrodes 16b may be disposed outside.

While the mounting substrates with the multilayer ceramic capacitor mounted thereon have been explained as examples in the preferred embodiments described above, the configuration of the mounting substrate with a multilayer ceramic capacitor mounted according to the present invention may be modified optionally within the scope of the inventive configuration as specified by the claims.

A mounting substrate according to a preferred embodiment of the present invention is used in a preferred manner as, in particular, a mounting substrate with a multilayer ceramic capacitor mounted as a coupling capacitor, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A mounting substrate comprising:
   an output electrode that outputs signals including a frequency region of 10 GHz or higher;
   an input electrode that inputs signals including a frequency region of 10 GHz or higher; and
   a multilayer ceramic capacitor connected to the output electrode and the input electrode; wherein
   the multilayer ceramic capacitor includes:
      a laminated body including a plurality of dielectric layers and a plurality of internal electrodes, a first principal surface and a second principal surface opposed in a laminating direction, a first side surface and a second side surface opposed in a width direction perpendicular or substantially perpendicular to the laminating direction, and a first end surface and a second end surface opposed in a length direction perpendicular or substantially perpendicular to the laminating direction and the width direction;
a first external electrode that covers the first end surface, and extends from the first end surface and covers the first principal surface, the second principal surface, the first side surface, and the second side surface; and
a second external electrode that covers the second end surface, and extends from the second end surface and covers the first principal surface, the second principal surface, the first side surface, and the second side surface; wherein
the plurality of internal electrodes includes a first internal electrode connected to the first external electrode and a second internal electrode connected to the second external electrode;
as viewed in cross sections including the first external electrode on the first principal surface, the second principal surface, the first side surface, and the second side surface, and cross sections including the second external electrode on the first principal surface, the second principal surface, the first side surface, and the second side surface:
a longest dimension is about 40 µm or less among dimensions in the laminating direction from the internal electrode located closest to the first principal surface in the laminating direction, among the first internal electrode and the second internal electrode, to a surface of the external electrode disposed on a side closer to the first principal surface, and from the internal electrode located closest to the second principal surface in the laminating direction, among the first internal electrode and the second internal electrode, to a surface of the external electrode disposed on a side closer to the second principal surface; and
a longest dimension is about 40 µm or less among dimensions in a width direction from a surface of the first internal electrode or the second internal electrode located closest to the first side surface in the width direction, among the first internal electrode and the second internal electrode, to a surface of the external electrode disposed on a side closer to the first side surface, and from the surface of the first internal electrode or the second internal electrode located closest to the second side surface in the width direction, among the first internal electrode and the second internal electrode, to a surface of the external electrode disposed on a side closer to the second side surface.

2. The mounting substrate according to claim 1, wherein a difference is about 10 µm or less between the longest dimension among dimensions in the laminating direction from the internal electrode located closest to the first principal surface in the laminating direction, among the first internal electrode and the second internal electrode, to the surface of the external electrode disposed on the side closer to the first principal surface, and from the internal electrode located closest to the second principal surface in the laminating direction, among the first internal electrode and the second internal electrode, to the surface of the external electrode disposed on the side closer to the second principal surface; and
the longest dimension among dimensions in the width direction from the surface of the first internal electrode or the second internal electrode located closest to the first side surface in the width direction, among the first internal electrode and the second internal electrode, to a surface of the external electrode disposed on a side closer to the first side surface, and from the surface of the first internal electrode or the second internal electrode located closest to the second side surface in the width direction, among the first internal electrode and the second internal electrode, to the surface of the external electrode disposed on the side closer to the second side surface.

3. The mounting substrate according to claim 1, wherein the plurality of internal electrodes includes a plurality of first internal electrodes and a plurality of second internal electrodes;
the plurality of first internal electrodes and the plurality of second internal electrodes have a dimension of about 0.3 µm or more and about 1.0 µm or less in the laminating direction, and a total number of the first internal electrodes and the second internal electrodes is 150 or more and 350 or less.

4. The mounting substrate according to claim 1, wherein the multilayer ceramic capacitor has a dimension of about 0.2 mm or more and about 0.7 mm or less in the length direction.

5. The mounting substrate according to claim 1, wherein the first external electrode and the second external electrode each includes a base electrode disposed on the laminated body, and a plated layer disposed on the base electrode, and the plated layer includes Au.

6. The mounting substrate according to claim 1, wherein the internal electrodes include Cu.

7. The mounting substrate according to claim 1, wherein the internal electrodes include Ni.

8. The mounting substrate according to claim 1, wherein the laminated body has a parallelepiped shape.

9. A mounting substrate comprising:
an output electrode that outputs signals including a frequency region of 10 GHz or higher;
an input electrode that inputs signals including a frequency region of 10 GHz or higher; and
a first multilayer ceramic capacitor and a second multilayer ceramic capacitor each connected to the output electrode and the input electrode; wherein
each of the first multilayer ceramic capacitor and the second multilayer capacitor includes:
a laminated body including a plurality of dielectric layers laminated and a plurality of internal electrodes, a first principal surface and a second principal surface opposed in a laminating direction, a first side surface and a second side surface opposed in a width direction perpendicular or substantially perpendicular to the laminating direction, and a first end surface and a second end surface opposed in a length direction perpendicular or substantially perpendicular to the laminating direction and the width direction;
a first external electrode that covers the first end surface, and extend from the first end surface and covers the first principal surface, the second principal surface, the first side surface, and the second side surface; and
a second external electrode that covers the second end surface, and extend from the second end surface and covers the first principal surface, the second principal surface, the first side surface, and the second side surface; wherein
the plurality of internal electrodes includes a first internal electrode connected to the first external electrode and a second internal electrode connected to the second external electrode;

as viewed in cross sections including the first external electrode on the first principal surface, the second principal surface, the first side surface, and the second side surface, and cross sections including the second external electrode on the first principal surface, the second principal surface, the first side surface, and the second side surface:

a longest dimension is about 40 μm or less among dimensions in the laminating direction from the internal electrode located closest to the first principal surface in the laminating direction, among the first internal electrode and the second internal electrode, to a surface of the external electrode disposed on a side closer to the first principal surface, and from the internal electrode located closest to the second principal surface in the laminating direction, among the first internal electrode and the second internal electrode, to a surface of the external electrode disposed on a side closer to the second principal surface; and a longest dimension is about 40 μm or less among dimensions in a width direction from a surface of the first internal electrode or the second internal electrode located closest to the first side surface in the width direction, among the first internal electrode and the second internal electrode, to a surface of the external electrode disposed on a side closer to the first side surface, and from the surface of the first internal electrode or the second internal electrode located closest to the second side surface in the width direction, among the first internal electrode and the second internal electrode, to a surface of the external electrode disposed on a side closer to the second side surface;

the first multilayer ceramic capacitor is mounted such that the plurality of internal electrodes of the first multilayer ceramic capacitor is parallel or substantially parallel to a mounting surface; and the second multilayer ceramic capacitor is mounted such that the plurality of internal electrodes of the second multilayer ceramic capacitor is perpendicular or substantially perpendicular to a mounting surface.

10. The mounting substrate according to claim 9, wherein a difference is about 10 μm or less between the longest dimension among dimensions in the laminating direction from the internal electrode located closest to the first principal surface in the laminating direction, among the first internal electrode and the second internal electrode, to the surface of the external electrode disposed on the side closer to the first principal surface, and from the internal electrode located closest to the second principal surface in the laminating direction, among the first internal electrode and the second internal electrode, to the surface of the external electrode disposed on the side closer to the second principal surface; and the longest dimension among dimensions in the width direction from the surface of the first internal electrode or the second internal electrode located closest to the first side surface in the width direction, among the first internal electrode and the second internal electrode, to a surface of the external electrode disposed on a side closer to the first side surface, and from the surface of the first internal electrode or the second internal electrode located closest to the second side surface in the width direction, among the first internal electrode and the second internal electrode, to the surface of the external electrode disposed on the side closer to the second side surface.

11. The mounting substrate according to claim 9, wherein the plurality of internal electrodes includes a plurality of first internal electrodes and a plurality of second internal electrodes;

the plurality of first internal electrodes and the plurality of second internal electrodes have a dimension of about 0.3 μm or more and about 1.0 μm or less in the laminating direction, and a total number of the first internal electrodes and the second internal electrodes is 150 or more and 350 or less.

12. The mounting substrate according to claim 9, wherein each of the first and second multilayer ceramic capacitors has a dimension of about 0.2 mm or more and about 0.7 mm or less in the length direction.

13. The mounting substrate according to claim 9, wherein the first external electrode and the second external electrode each includes a base electrode disposed on the laminated body, and a plated layer disposed on the base electrode, and the plated layer includes Au.

14. The mounting substrate according to claim 9, wherein the internal electrodes include Cu.

15. The mounting substrate according to claim 9, wherein the internal electrodes include Ni.

16. The mounting substrate according to claim 9, wherein the laminated body has a parallelepiped shape.

* * * * *